(12) United States Patent  
Mruthyunjaya

(10) Patent No.: US 10,269,839 B2  
(45) Date of Patent: Apr. 23, 2019

(54) APPARATUS AND METHOD USING A DUAL GATE TFT STRUCTURE

(71) Applicant: Carestream Health, Inc., Rochester, NY (US)

(72) Inventor: Ravi K. Mruthyunjaya, Penfield, NY (US)

(73) Assignee: Carestream Health, Inc., Rochester, NY (US)

( * ) Notice: Subject to any disclaimer, the term of this patent is extended or adjusted under 35 U.S.C. 154(b) by 541 days.

(21) Appl. No.: 14/979,683

(22) Filed: Dec. 28, 2015

(65) Prior Publication Data

US 2016/0284748 A1 Sep. 29, 2016

Related U.S. Application Data

(60) Provisional application No. 62/138,628, filed on Mar. 26, 2015.

(51) Int. Cl.
| | | |
|---|---|---|
| *G01T 1/24* | (2006.01) | |
| *H01L 27/146* | (2006.01) | |
| *H04N 5/32* | (2006.01) | |
| *H04N 5/374* | (2011.01) | |

(52) U.S. Cl.
CPC ........ *H01L 27/14609* (2013.01); *G01T 1/247* (2013.01); *H01L 27/14614* (2013.01); *H01L 27/14632* (2013.01); *H01L 27/14658* (2013.01); *H01L 27/14687* (2013.01); *H01L 27/14692* (2013.01); *H04N 5/32* (2013.01); *H04N 5/3741* (2013.01); *H01L 27/14641* (2013.01)

(58) Field of Classification Search
CPC .......................... H01L 27/14609; G01T 1/247
USPC ....................................................... 250/370.09
See application file for complete search history.

(56) References Cited

U.S. PATENT DOCUMENTS

| | | | |
|---|---|---|---|
| 6,566,685 B2 * | 5/2003 | Morikawa | H01L 27/14609 257/432 |
| 7,564,022 B1 * | 7/2009 | Dierickx | H03F 3/08 250/214 R |
| 9,490,366 B2 * | 11/2016 | Yan | H01L 29/66969 |
| 2009/0295697 A1 | 12/2009 | Su | |
| 2010/0295978 A1 * | 11/2010 | Nakamura | H01L 27/14609 348/273 |
| 2013/0146866 A1 | 6/2013 | Kitagawa et al. | |
| 2015/0083924 A1 | 3/2015 | Okada et al. | |
| 2016/0267716 A1 * | 9/2016 | Patel | G09G 5/395 |

FOREIGN PATENT DOCUMENTS

WO 2013/180077 A1 5/2013

OTHER PUBLICATIONS

International Search Report, International application No. PCT/US2016/014019, dated Apr. 5, 2016, 2 pages.

* cited by examiner

*Primary Examiner* — David P Porta
*Assistant Examiner* — Abra S. Fein

(57) ABSTRACT

A detector having an array of pixels arranged in columns and rows. Each of the pixels has a photosensor and a switch device. The switch devices in each pair of row-adjacent pixels are connected to a common data line and a common bottom gate line. A pair of top gate lines are each connected to one of the pair of row-adjacent pixels.

19 Claims, 9 Drawing Sheets

PIXEL STRUCTURE

SINGLE PIXEL

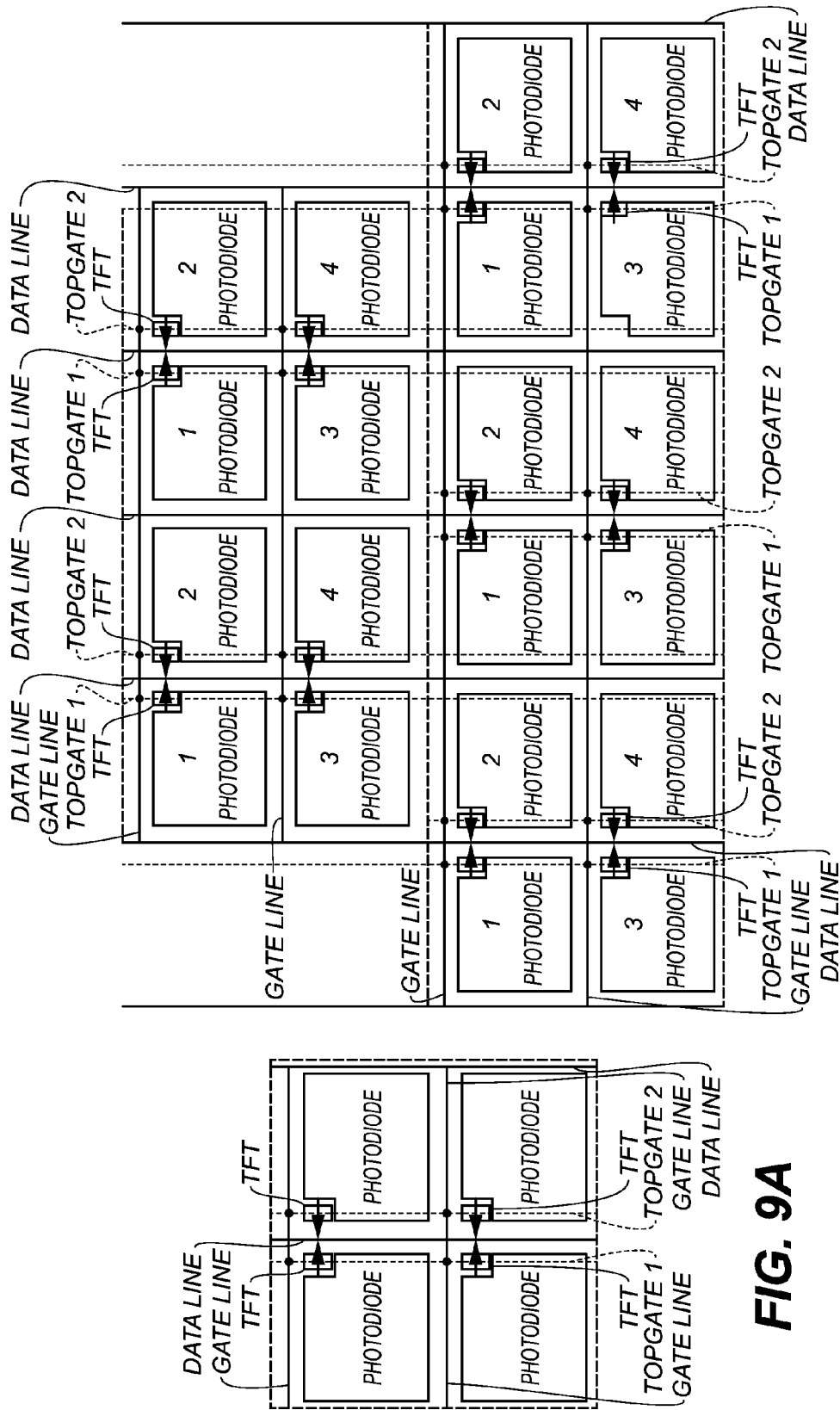

APPARATUS AND METHOD USING A DUAL GATE TFT STRUCTURE

CROSS REFERENCE TO RELATED APPLICATIONS

This application claims priority to U.S. Patent Application Ser. No. 62/138,628, filed Mar. 26, 2015, in the name of Mruthyunjaya, and entitled MULTIPLEXING APPARATUS AND METHOD USING A DUAL GATE TFT STRUCTURE.

This application is related in certain respects to U.S. patent application Ser. No. 14/972,561, filed Dec. 17, 2015, in the name of Mruthyunjaya, and entitled COMPENSATION CIRCUIT FOR AN X-RAY DETECTOR; and U.S. patent application Ser. No. 14/972,628, filed Dec. 17, 2015, in the name of Tredwell, and entitled THRESHOLD VOLTAGE CALIBRATION AND COMPENSATION CIRCUIT FOR A DIGITAL RADIOGRAPHIC DETECTOR, both of which are incorporated herein by reference in their entirety.

BACKGROUND OF THE INVENTION

Digital X-ray detectors (DXDs) contain a two-dimensional array of pixel elements. Each pixel element typically contains a diode element and a thin film transistor (TFT) element. The diode element collects light that is converted from Xrays incident on a scintillator material. The TFT element acts as a switch. When the switch is turned "OFF", no charge is transferred from the diode element onto the readout circuitry via the data line. When the switch is turned "ON", any charge collected on the diode element is transferred onto readout circuitry via the data line. The TFT element configuration is controlled by an applied gate voltage. In the case of DXD detectors the applied gate voltage is a ROW based operation where all pixels in a given ROW have a common row gate control line.

FIG. 1 is a perspective view of a prior art digital radiographic (DR) imaging system 10 that includes a generally planar DXD 40 (shown without a housing for clarity of description), an x-ray source 14 configured to generate radiographic energy (x-ray radiation), and a digital monitor 26 configured to display images captured by the DXD 40, according to one embodiment. The DXD 40 may include a two dimensional array 12 of detector cells 22 (photodiodes), arranged in electronically addressable rows and columns. The DXD 40 may be positioned to receive x-rays 16 passing through a subject 20 during a radiographic energy exposure, or radiographic energy pulse, emitted by the x-ray source 14. As shown in FIG. 1, the radiographic imaging system 10 may use an x-ray source 14 that emits collimated x-rays 16, e.g. an x-ray beam, selectively aimed at and passing through a preselected region 18 of the subject 20. The x-ray beam 16 may be attenuated by varying degrees along its plurality of rays according to the internal structure of the subject 20, which attenuated rays are detected by the array 12 of photosensitive detector cells 22. The planar DXD 40 is positioned, as much as possible, in a perpendicular relation to a substantially central ray 17 of the plurality of rays 16 emitted by the x-ray source 14. The array 12 of individual photosensitive cells (pixels) 22 may be electronically addressed (scanned) by their position according to column and row. As used herein, the terms "column" and "row" refer to the vertical and horizontal arrangement of the photosensor cells 22 and, for clarity of description, it will be assumed that the rows extend horizontally and the columns extend vertically. However, the orientation of the columns and rows is arbitrary and does not limit the scope of any embodiments disclosed herein. Furthermore, the term "subject" may be illustrated as a human patient in the description of FIG. 1, however, a subject of a DR imaging system, as the term is used herein, may be a human, an animal, an inanimate object, or a portion thereof.

In one exemplary embodiment, the rows of photosensitive cells 22 may be scanned one or more at a time by electronic scanning circuit 28 so that the exposure data from the array 12 may be transmitted to electronic read-out circuit 30. Each photosensitive cell 22 may independently store a charge proportional to an intensity, or energy level, of the attenuated radiographic radiation, or x-rays, received and absorbed in the cell. Thus, each photosensitive cell, when read-out, provides information defining a pixel of a radiographic image 24, e.g. a brightness level or an amount of energy absorbed by the pixel, that may be digitally decoded by image processing electronics 34 and transmitted to be displayed by the digital monitor 26 for viewing by a user. An electronic bias circuit 32 is electrically connected to the two-dimensional detector array 12 to provide a bias voltage to each of the photosensitive cells 22.

Each of the bias circuit 32, the scanning circuit 28, and the read-out circuit 30, may communicate with an acquisition control and image processing unit 34 over a connected cable (wired) 33, or the DR detector may be equipped with a wireless transmitter to transmit radiographic image data wirelessly 35 to the acquisition control and image processing unit 34. The bias circuit 32, the scanning circuit 28, and the read-out circuit 30 may be formed as electronic integrated circuits for readout (ROICs). The acquisition control and image processing unit 34 may include a processor and electronic memory (not shown) to control operations of the DXD 40 as described herein, including control of ROICs 28, 30, and 32, for example, by use of programmed instructions. The acquisition control and image processing unit 34 may also be used to control activation of the x-ray source 14 during a radiographic exposure, controlling an x-ray tube electric current magnitude, and thus the fluence of x-rays in x-ray beam 16, and/or the x-ray tube voltage, and thus the energy level of the x-rays in x-ray beam 16.

The acquisition control and image processing unit 34 may transmit image (pixel) data to the monitor 26, based on the radiographic exposure data received from the array 12 of photosensitive cells 22. Alternatively, acquisition control and image processing unit 34 can process the image data and store it, or it may store raw unprocessed image data, in local or remotely accessible memory.

With regard to a direct detection embodiment of DXD 40, the photosensitive cells 22 may each include a sensing element sensitive to x-rays, i.e. it absorbs x-rays and generates an amount of charge carriers in proportion to a magnitude of the absorbed x-ray energy. A switching element may be configured to be selectively activated to read out the charge level of a corresponding x-ray sensing element. With regard to an indirect detection embodiment of DXD 40, photosensitive cells 22 may each include a sensing element sensitive to light rays in the visible spectrum, i.e. it absorbs light rays and generates an amount of charge carriers in proportion to a magnitude of the absorbed light energy, and a switching element that is selectively activated to read the charge level of the corresponding sensing element. A scintillator, or wavelength converter, is disposed over the light sensitive sensing elements to convert incident x-ray radiographic energy to visible light energy.

Examples of sensing elements used in sensing array 12 include various types of photoelectric conversion devices (e.g., photosensors) such as photodiodes (P-N or PIN diodes), photo-capacitors (MIS), photo-transistors or photoconductors. Examples of switching elements used for signal read-out include MOS transistors, bipolar transistors and other p-n junction components.

FIG. 2A is a schematic diagram 240 of a portion of a two-dimensional array 12 for a DXD 40. The array of photosensor cells 212, whose operation may be consistent with the photosensor array 12 described above, may include a number of amorphous silicon (a-Si) or hydrogenated amorphous silicon (a-Si:H) n-i-p photodiodes 270 and thin film transistors (TFTs) 271 formed as field effect transistors (FETs) each having gate (G), source (S), and drain (D) terminals. In embodiments of DXD 40 disclosed herein, the two-dimensional array of photosensor cells 12 may be formed in a device layer that abuts adjacent layers of the DR detector structure. A plurality of gate driver circuits 228 (ROICs) may be electrically connected to a plurality of gate lines 283 which control a voltage applied to the gates of TFTs 271, a plurality of readout circuits 230 (ROICs) may be electrically connected to data lines 284, and a plurality of bias lines 285 may be electrically connected to a bias line bus or a variable bias reference voltage line 232 which controls a voltage applied to the photodiodes 270. Charge amplifiers 286 may be electrically connected to the data lines 284 to receive signals therefrom. Outputs from the charge amplifiers 286 may be electrically connected to a multiplexer 287, such as an analog multiplexer, then to an analog-to-digital converter (ADC) 288, or they may be directly electrically connected to the ADC, to stream out the digital radiographic image data at desired rates. In one embodiment, the schematic diagram of FIG. 2 may represent a portion of a DXD 40 such as an a-Si based indirect flat panel imager as described below.

Incident x-rays, or x-ray photons, 16 are converted to optical photons, or light rays, by a scintillator, which light rays are subsequently converted to electron-hole pairs, or charges, upon impacting the a-Si n-i-p photodiodes 270. In one embodiment, an exemplary detector cell 222, which may be equivalently referred to herein as a pixel, may include a photodiode 270 having its anode electrically connected to a bias line 285 and its cathode electrically connected to the drain (D) of TFT 271. The bias reference voltage line 232 can control a bias voltage of the photodiodes 270 at each of the detector cells 222. The charge capacity of each of the photodiodes 270 is a function of its bias voltage and its capacitance. In general, a reverse bias voltage, e.g. a negative voltage, may be applied to the bias lines 285 to create an electric field (and hence a depletion region) across the pn junction of each of the photodiodes 270 to enhance its collection efficiency for the charges generated by incident light rays. The image signal represented by the array of photosensor cells 212 may be integrated by the photodiodes while their associated TFTs 271 are held in a non-conducting (off) state, for example, by maintaining the gate lines 283 at a negative voltage via the gate driver circuits 228. The photosensor cell array 212 may be read out by sequentially switching rows of the TFTs 271 to a conducting (on) state by means of the gate driver circuits 228. When a row of the pixels 22 is switched to a conducting state, for example by applying a positive voltage to the corresponding gate line 283, collected charge from the photodiode in those pixels may be transferred along data lines 284 and integrated by the external charge amplifier circuits 286. The row may then be switched back to a non-conducting state, and the process is repeated for each row until the entire array of photosensor cells 212 has been read out. The integrated signal outputs are transferred from the external charge amplifiers 286 to an analog-to-digital converter (ADC) 288 using a parallel-to-serial converter, such as multiplexer 287, which together comprise read-out circuit 230.

This digital image information may be subsequently processed by image processing system 34 to yield a digital image which may then be digitally stored and immediately displayed on monitor 26, or it may be displayed at a later time by accessing the digital electronic memory containing the stored image. The flat panel DXD 40 having an imaging array as described with reference to FIG. 2 may be capable of both single-shot (e.g., static, radiographic) and continuous (e.g., fluoroscopic) image acquisition. Moreover, much of the control electronics in the image processing system 34 may be contained with a housing of the DXD panel 40.

FIG. 2B shows an example schematic of a single pixel structure with one photodiode element, and one TFT element controlled by a single gate line control per physical row, illustrating exemplary voltage control levels for the gate line (row) of about 20 V ("on") to about −4 V ("off"). For a given pixel size the majority of the area is taken by the photodiode element, as illustrated in the area representation of an imaging pixel of FIG. 2C. Some of the area may be taken by the TFT element. The TFT size may be as small as possible to maximize the area of the photodiode element. An indium gallium zinc oxide (IGZO) TFT element due to its higher mobility can be made smaller than an amorphous silicon (a-Si) TFT.

FIG. 3 shows an example two-dimensional array area layout of the single unit pixel of FIG. 2C. The number of data line (readout) output lines 302 in the array will equal the number of physical columns. The number of gate lines 304 in the array will equal the number of physical rows. Also, the number of TFT elements on the output data line is equal to the number of rows. For a large DXD detector there may be many ROIC assemblies required to readout the entire panel. In a high performance panel and a dual sided readout configuration a second set of ROIC assemblies is a common architecture. For low cost detector DXD applications, it would be advantageous to reduce the number of required ROIC assemblies to reduce DXD panel cost.

One way to reduce the number of external ROICs is illustrated in FIG. 4 which shows a common multiplexing architecture where two data lines from the pixel array are multiplexed down to one physical data line output using a multiplexing circuit ("mux") at the array end. This is a common architecture of an array of single pixels and a multiplexing output data line placed at one end of the array. In this configuration two separate and adjacent pixel data lines can be reduced to one, which may result in a 2× reduction in the number of ROICs. In order to successfully read out all pixels using one shared data line, typically it would take two line readout times in order to readout one physical row. One method of using the structure of FIG. 4 is to combine the detected photodiode charges in horizontally adjacent pixels that share one output data line, referred to as binning or, more specifically, horizontal 2× binning. This multiplexing scheme does not provide a signal-to-noise (SNR) advantage with respect to horizontal charge binning due to the fact that charge is shared on two separate data lines (prior to the mux) and data line noise is the dominant noise source in a typical DXD panel.

BRIEF DESCRIPTION OF THE INVENTION

It would be advantageous to provide multiplexing within the pixel and share one common data line in order to both reduce the number of data lines and take advantage of the SNR benefit of horizontal charge binning due to reduced data line capacitance. It is also important to note that an IGZO TFT can be made smaller compared to an a-Si TFT. For example, a 2× reduction in TFT size will allow for two times the number of TFT structures with similar DXD noise.

A detector having an array of pixels arranged in columns and rows is disclosed. Each of the pixels has a photosensor and a switch device. The switch devices in each pair of row-adjacent pixels are connected to a common data line and a common bottom gate line. A pair of top gate lines are each connected to one of the pair of row-adjacent pixels. Advantages that may be realized in the practice of some embodiments disclosed herein are a reduced number of output data lines for lower cost DXDs, adjacent horizontal 2× charge binning with signal to noise benefit, no reduction of full resolution frame-rate while still having a multiplexing pixel, improvement in frame-rate in a horizontal 2× charge bin mode compared to a standard approach, and an improvement in frame rate in a 4× charge bin (2×2) mode compared to a standard approach readout scheme.

In one embodiment, a method of operating a detector includes activating a TFT switch and a top gate in each of two row adjacent pixels and simultaneously reading out the charge from the two row-adjacent pixels over one data line.

In another embodiment, a method of reading out the charge individually from each of an array of pixels comprises activating a first top gate line in a first one of two row-adjacent pixels during a first line time and activating a second top gate line in a second one of the two row-adjacent pixels to read out the charge from the second one of the two row-adjacent pixels during a second line time.

In another embodiment, a detector includes an array of pixels arranged in columns and rows, wherein each of the pixels comprises a photosensor. A switch device in each of a pair of row-adjacent pixels are connected to a common data line and a common bottom gate line.

In another embodiment, a method of operating a detector comprises capturing a radiographic image in the detector, activating a TFT switch and a top gate in each of two row adjacent pixels in a first row and in each of two row adjacent pixels in a second row. The charge from the row-adjacent pixels in the first row and the second row are simultaneously read out over only one data line.

The summary descriptions above are not meant to describe individual separate embodiments whose elements are not interchangeable. In fact, many of the elements described as related to a particular embodiment can be used together with, and possibly interchanged with, elements of other described embodiments. Many changes and modifications may be made within the scope of the present invention without departing from the spirit thereof, and the invention includes all such modifications. The drawings below are intended to be drawn neither to any precise scale with respect to relative size, angular relationship, relative position, or timing relationship, nor to any combinational relationship with respect to interchangeability, substitution, or representation of a required implementation.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of the invention. In the drawings, like numerals are used to indicate like parts throughout the various views. Thus, for further understanding of the invention, reference can be made to the following detailed description, read in connection with the drawings in which:

FIGS. 5A-5B show a comparison of two example TFT structures with their respective I-V curves wherein FIG. 5A shows a standard bottom only gate, and FIG. 5B shows an alternative TFT with top and bottom gate;

FIGS. 9A and 9B shows a 2×2 unit cell and an array of 2×2 unit cells that are staggered per ROW, respectively.

DETAILED DESCRIPTION OF THE INVENTION

Figure 5A:
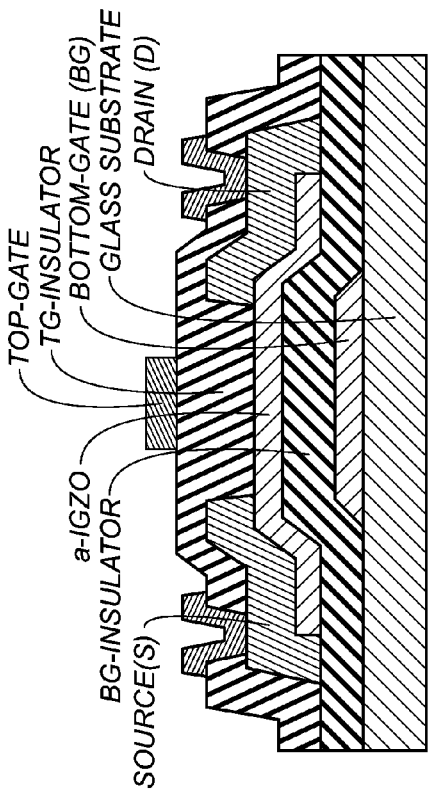
Figure 5A:
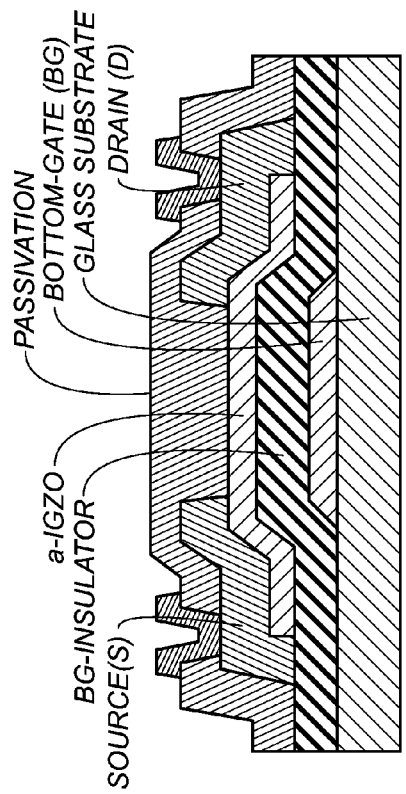
Figure 5B:
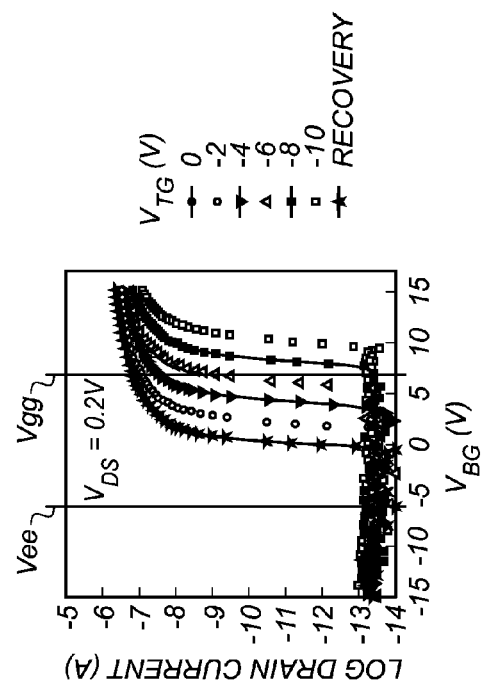
Figure 5B:
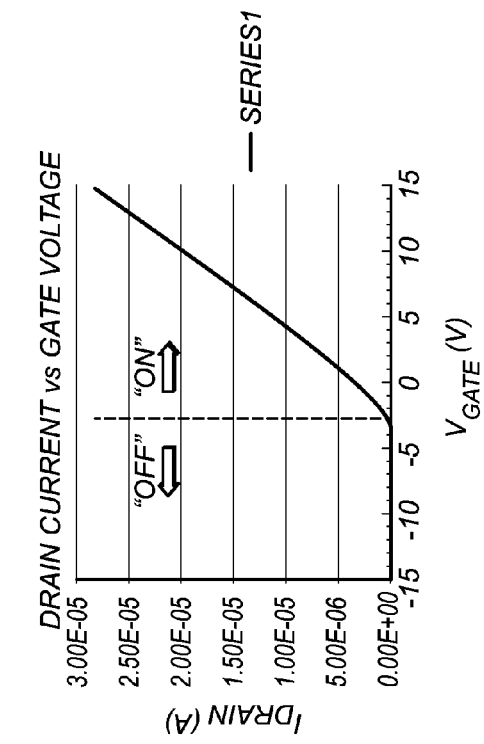

FIGS. 5A-5B show a comparison of two TFT element structures in cross section and their associated I-V curves ($I_d$ drain current vs. gate voltage). The active layer in these devices may comprise IGZO. The bottom portion of FIG. 5A illustrates a common I-V curve depiction for the single (bottom) gate control TFT structure shown in the top portion of FIG. 5A. This bottom gate electrode (BG) is connected to the ROW based readout of a DXD panel. An "OFF" and "ON" voltage for the BG is defined by the detector requirements. In IGZO TFTs, due to the higher mobility compared to a-Si TFTs, the "ON" voltage can also be made much lower than a-Si. The bottom of FIG. 5B illustrates measured I-V characteristics for the dual gate TFT structure shown in the top portion of FIG. 5B. The bottom portion of FIG. 5B illustrates a family of six curves for decreasing top gate voltages in steps of 0, −2, −4, −6, −8, and −10 V, wherein increasingly negative top gate voltage shifts the I-V curve to the right, i.e., higher gate voltage required for turning on the TFT. $V_{ee}$ and $V_{gg}$ represent the off and on gate line voltage levels for an exemplary DXD panel, respectively. As shown in the bottom portion of FIG. 5B, an applied top gate voltage of −10 V (I-V curve farthest to the right) is beyond the gate voltage on level $V_{gg}$ for the DXD panel and, thus, such an applied top gate voltage effectively disables the TFT and will prevent a turn on of the TFT using its bottom gate, thereby preventing any charge transfer from this TFTs photodiode to a connected data line. As used herein, the terms "off" and "on" will pertain to the TFT bottom gate voltage for turning on and off the gate of the TFT ("on" for reading out), while the terms "disable" and "enable" will pertain to the TFT top gate voltage for disabling and enabling the TFT for read out.

For a typical TFT structure, the I-V curve is represented by a single curve as shown in the bottom portion of FIG. 5A. The alternate TFT structure in the top portion of FIG. 5B is a dual gate TFT element that contains both bottom gate and top gate electrodes. Having a TFT with a separate TOP GATE electrode will allow the threshold voltage to be adjusted according to the I-V curves as explained herein. If the threshold voltage using a TOP GATE control line is set significantly negative, e.g. at −10 V in an exemplary configuration, then even when the bottom gate control is set "ON" no charge from the photodiode element will be transferred onto the data line and will still be detected as "OFF". Thus, we can define two new states as a function of the TOP GATE electrode. A large negative voltage will "DISABLE" the TFT from turning "ON" even if the bottom gate is set to "ON" state. The TFT will be "ENABLED" if the TOP GATE electrode voltage is set to zero volts or some voltage positive of zero volts. If the TFT is "ENABLED" and the bottom gate is "OFF" the TFT will still not transfer charge from the pixel photodiode to the data line the same way as a TFT structure with a bottom only gate structure. If the TFT is "ENABLED" and "ON" the TFT will transfer charge from the photodiode to the data line. In one embodiment, the TFT structure may have an offset TOP GATE 560 as depicted in FIG. 5C (narrow in the perspective of the figure) to minimize overlap capacitance with the data line to minimize the detector noise.

Figure 5D:
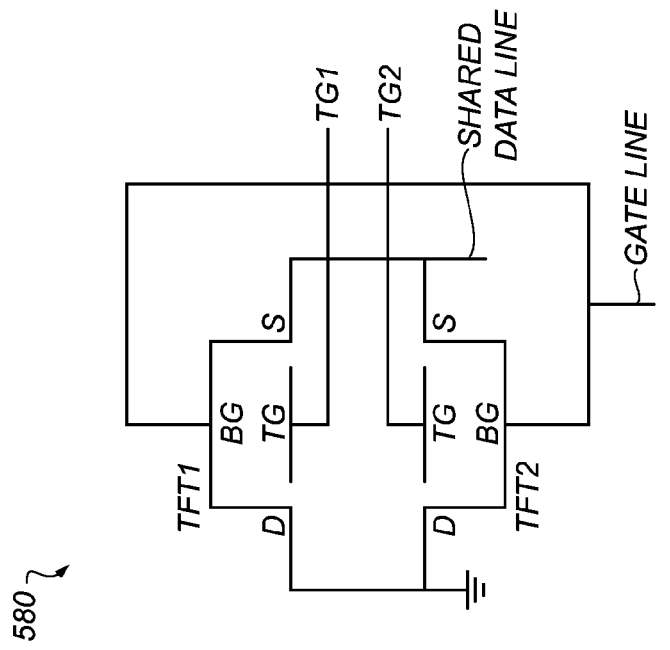
FIG. 5D shows an exemplary single pixel structure using an alternative two dual gate TFTs structure wherein two top gates, two bottom gates, and one photodiode may be used for readout operations.
Figure 5C:
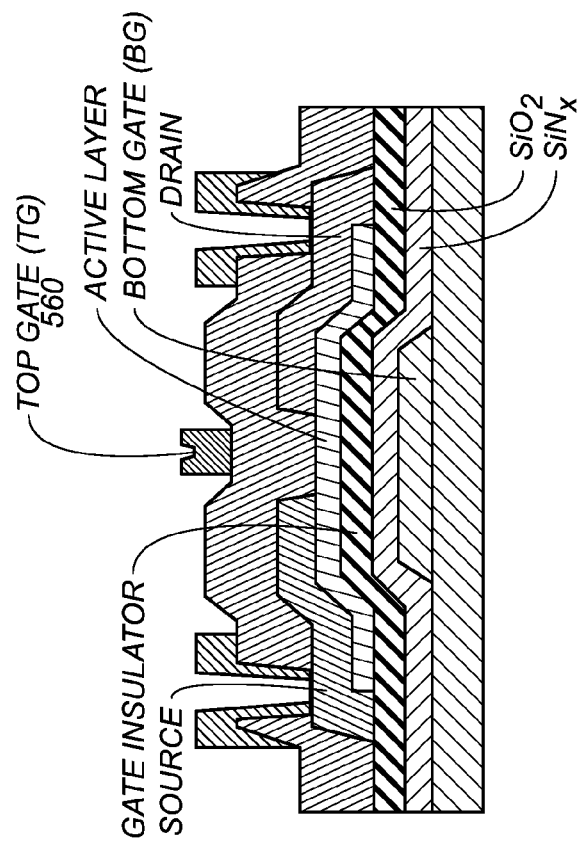
FIG. 5C shows an alternative TFT with bottom gate and a geometrically offset top gate to reduce capacitive coupling with the data line.

FIG. 5D illustrates a dual TFT structure 580 comprising two separate and independent TFTs, TFT1, TFT2, electrically connected with a common bottom gate, source and drain. The top gate electrodes, TG1, TG2, remain separate and independently controllable. When both TFTs are enabled, current flow will occur using both TFT structures at a specified $V_{GG}$ on level. When both TFTs are disabled, no current flow will occur at the specified $V_{GG}$ on level. When only one TFT is enabled, current will only flow through the enabled TFT while no current will flow through the disabled TFT. Each TFT may have its threshold voltage shifted beyond the $V_{GG}$ on level creating two operating states by use of a top gate electrode in order to place that TFT in a disabled state.

Figure 6:
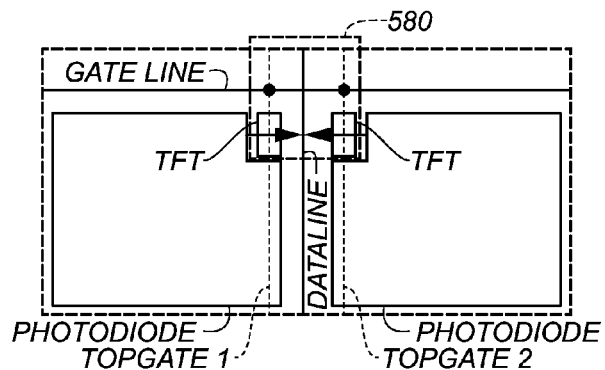
FIG. 6 shows an example shared pixel architecture where two mirrored horizontally adjacent pixels utilize the exemplary pixel structure of FIG. 5C.

Using these added two states from a top and bottom gate TFT structure where a large negative voltage on the top gate can adjust the threshold voltage to remain "OFF" even when the bottom gate is in the "ON" state, a top and bottom gate TFT structure can be utilized as an in-pixel multiplexer switch when each TFT TOP GATE is independently controlled. Using this top gate and bottom gate TFT structure we may fabricate a pixel architecture having two horizontally adjacent "mirrored" pixel structures and a common shared data line. FIG. 6 illustrates an exemplary embodiment of such a pixel architecture using the top gate and bottom gate dual TFT structure 580 as a multiplexing switch. The two mirrored horizontally adjacent pixels with separate TFTs share a data line and a single gate control line. Top gate 1 and top gate 2 control lines are shown electrically connected to the dual gate TFT structure in a direction substantially perpendicular to the gate line.

Figure 7:
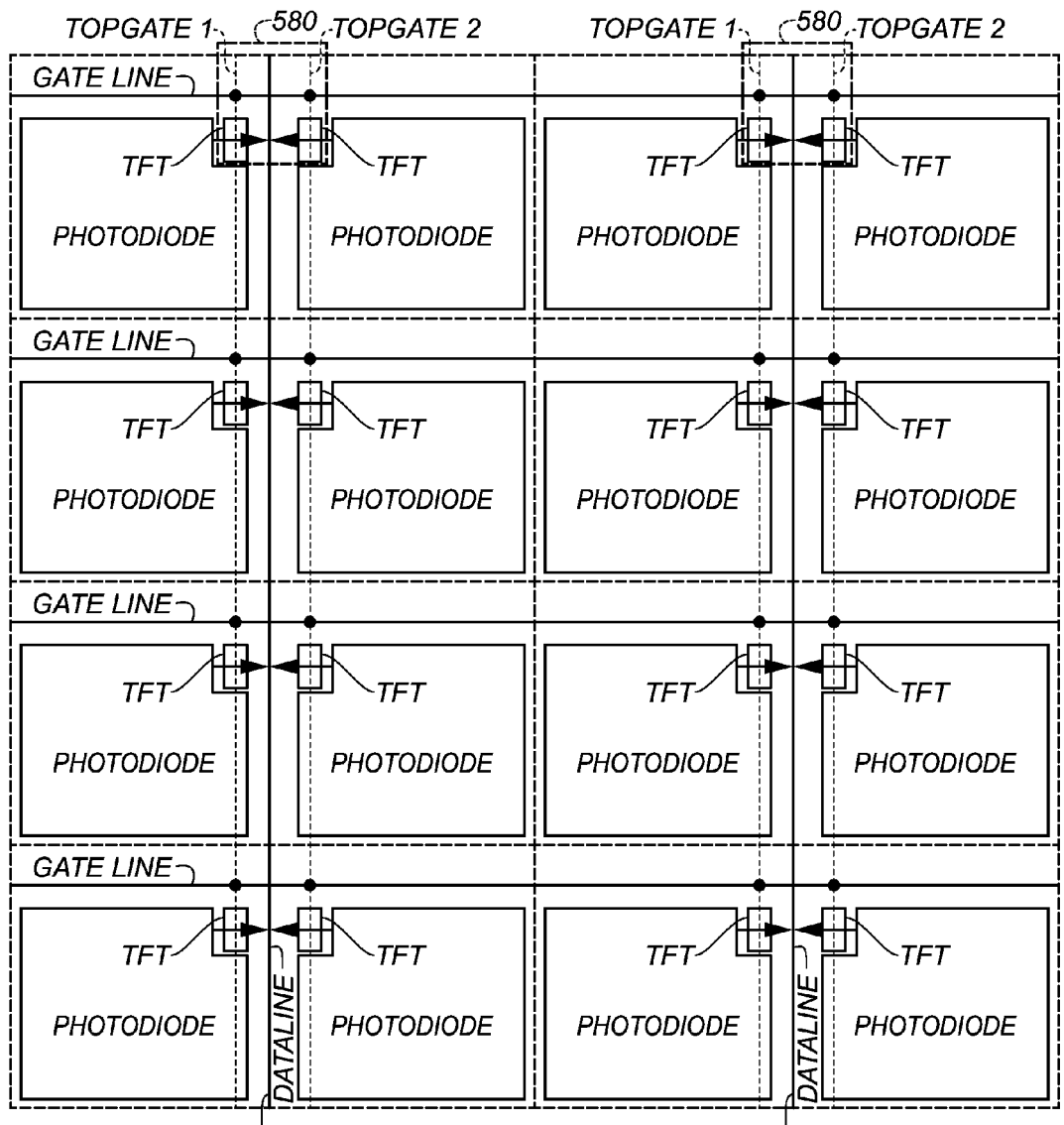
FIG. 7 is a schematic diagram of an exemplary array of the mirrored horizontally adjacent pixels sharing a common data line of FIG. 6.

FIG. 7 shows an array of pixels utilizing the dual TFT structure 580. The number of data lines 702 is half of the number of physical columns. This reduction in the number of data lines by a factor of two means that half the number of external readout ICs (ROICs) will be required and may lower the cost of DXD panels.

Figure 8A:
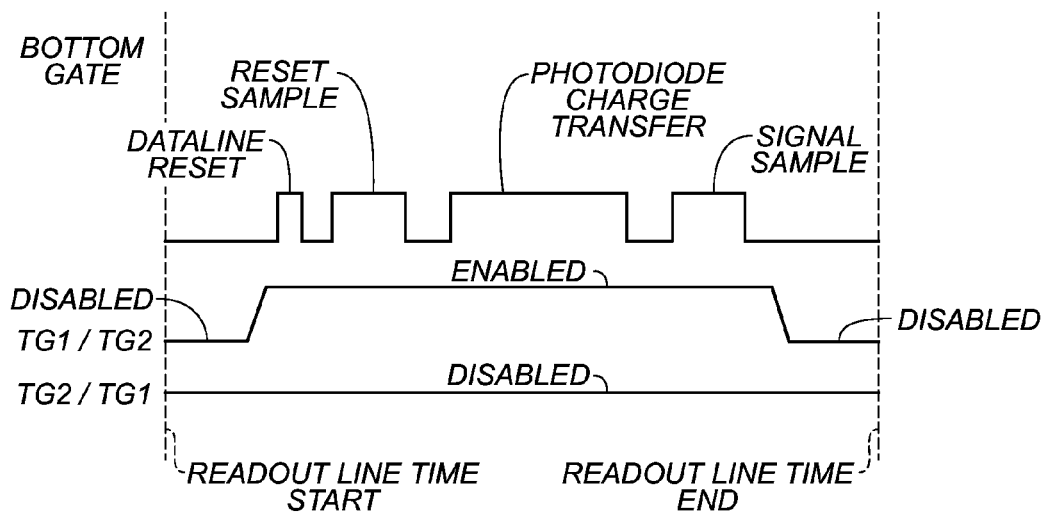
FIGS. 8A-8D are exemplary timing diagrams for DXD readout using the array structure of FIG. 7.

In order to readout both pixels using a shared data line, one TFT will be "DISABLED" and one TFT will be "ENABLED" by setting the independently controlled top gate voltages, TG1, TG2, accordingly, as explained herein. With reference to FIG. 8A, when the gate line (bottom gate) is "ON" (photodiode charge transfer) only the pixel photodiode that has an "ENABLED" TFT (using TG1) will transfer charge from the photodiode element to the data line while the other pixel photodiode is DISABLED (using TG2). At the next line time the other TFT (using TG2) will be "ENABLED" while the previously used TFT (using TG1) will be "DISABLED" such that the gate line, when "ON" will read the other photodiode element. Thus, this structure still requires two readout line times to readout one physical row. The term "line time" is used herein to refer to the readout sequence performed for a line of the array. In a prior art single gate TFT embodiment wherein the ROICs utilize a sample & hold scheme, a sequence of readout steps may include resetting the data line including flushing charge out of the readout IC and storing the reset level (reset sample), followed by reading the charge level in the photodiode (charge transfer) and storing that charge level as the pixel datum (signal sample). This sequence of steps is illustrated in FIGS. 8A-8D as the bottom gate timing. As shown in FIGS. 8A-8D, the TG1 and TG2 top gate lines may be switched between 0 V (ENABLE) and −10 V (DISABLE).

Figure 1:
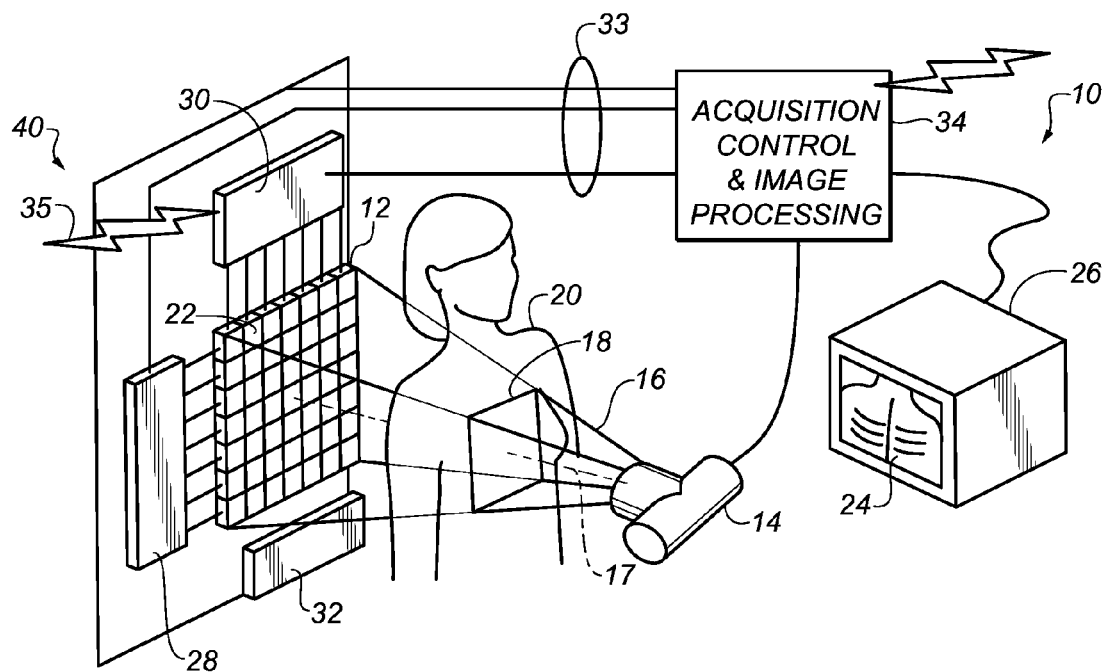
FIG. 1 illustrates an exemplary digital X-ray system.
Figure 2A:
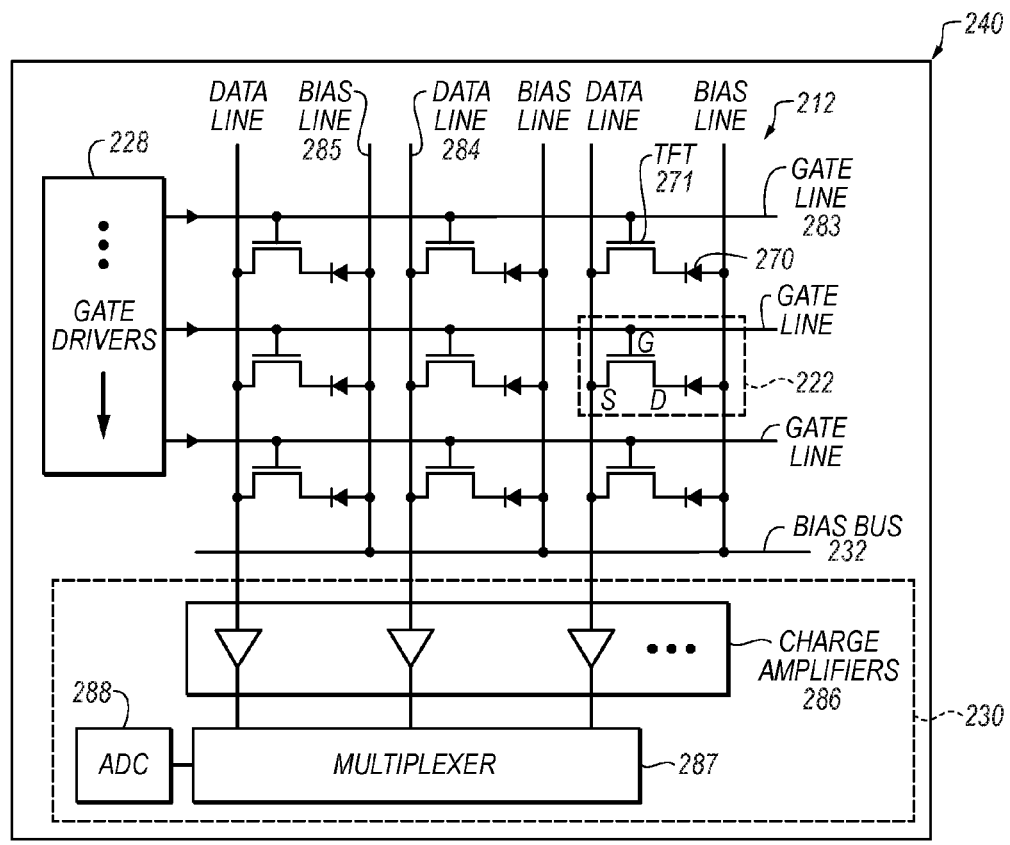
FIG. 2A is a diagram of an exemplary pixel array and DXD panel electronics.
Figure 2B:
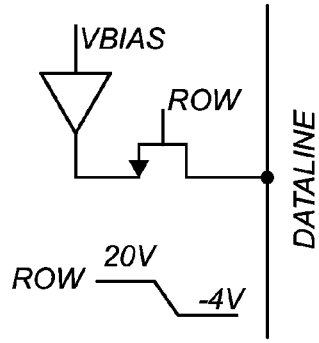
FIG. 2B shows an example schematic of a single pixel structure with one photodiode element and one TFT element.
Figure 2C:
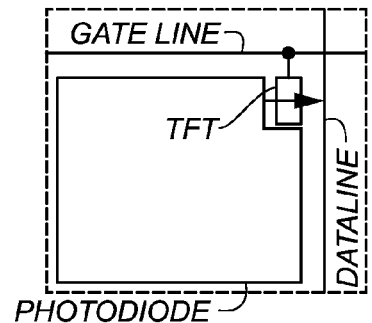
FIG. 2C shows an example typical single pixel area layout with the photodiode element and one TFT element controlled by one gate line control per physical row.
Figure 3:
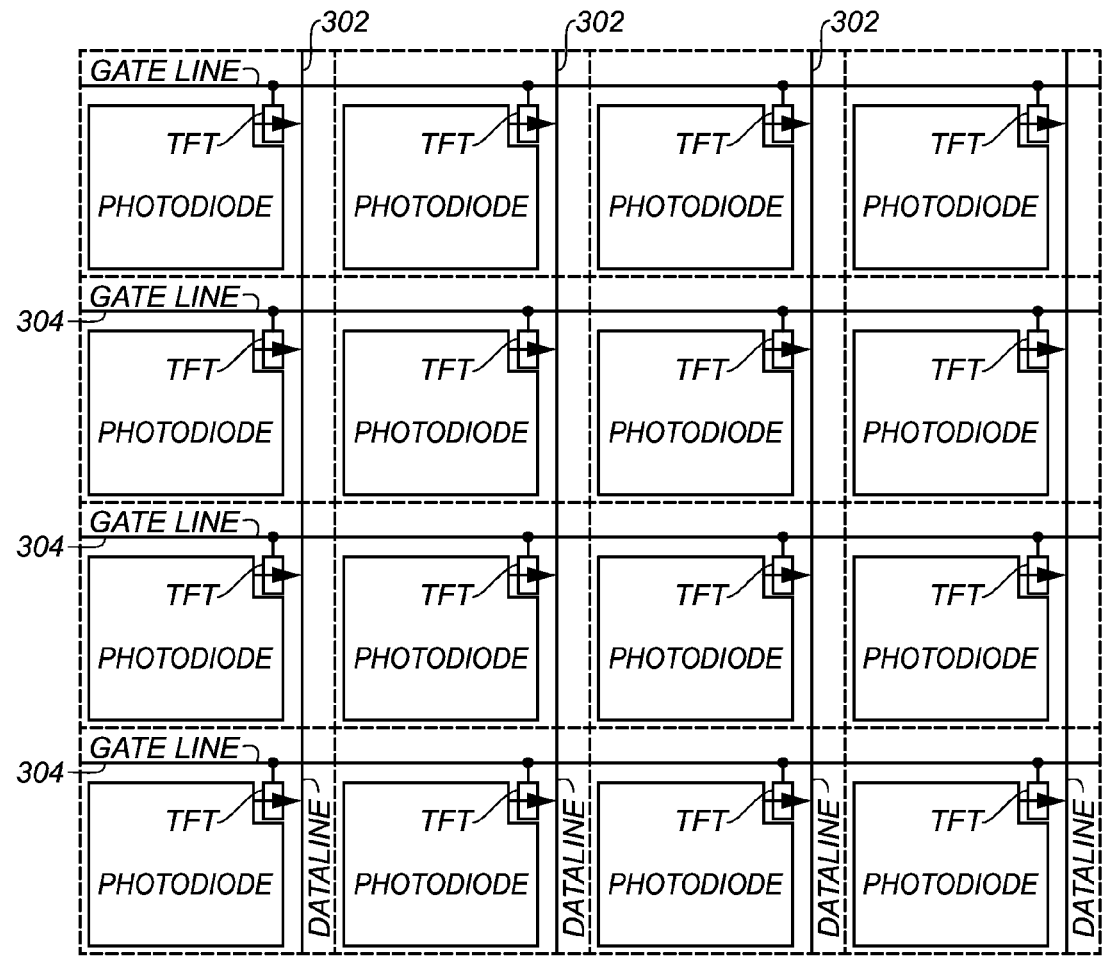
FIG. 3 shows an example array of single unit pixels of FIG. 2C.
Figure 4:
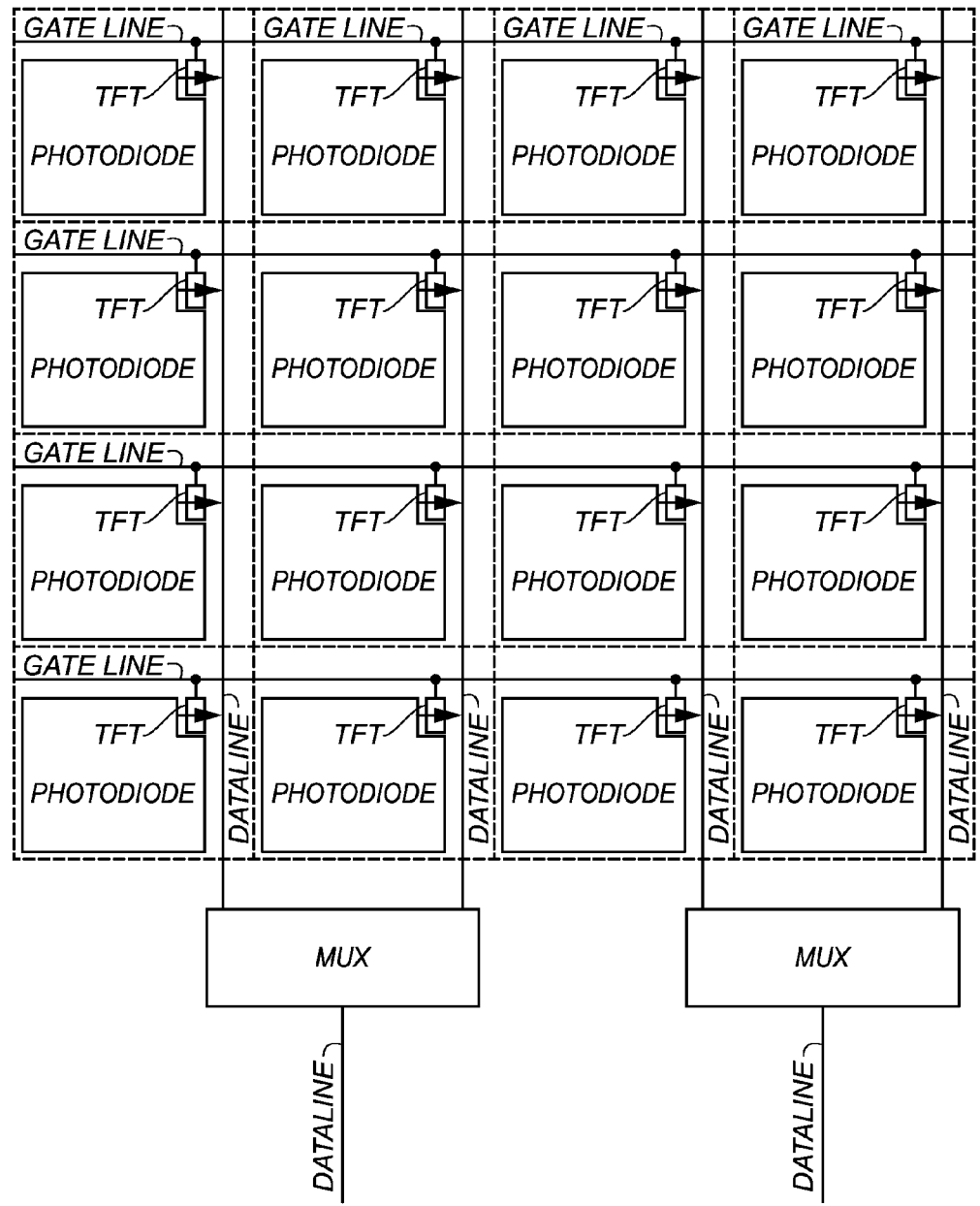
FIG. 4 shows the array area layout of the array of FIG. 3 but with a multiplexing architecture where two data lines from the pixel array are multiplexed down to one physical data line output using a multiplexing circuit at the array end.

If both TOP GATE voltages for each TFT are "ENABLED" then both photodiode elements will transfer charge onto the same common data line when the gate line is "ON". This configuration allows for horizontal charge binning. A signal to noise benefit will be seen in this case due to the fact that a shared common data line is used within the array compared to separate data lines in the typical multiplexing scheme outside the pixel array (FIG. 4).

Consideration may be taken with respect to timing of the array signals. Any switching element will inject/remove charge into/from the data line and photodiode in the transition from "OFF" to "ON" and vice versa. This is also true with a bottom only TFT structure as is well known. A similar injection/removal of charge will occur with a TFT structure having a top gate electrode in the transition from "DISABLE" to "ENABLE", and vice versa.

Figure 8B:
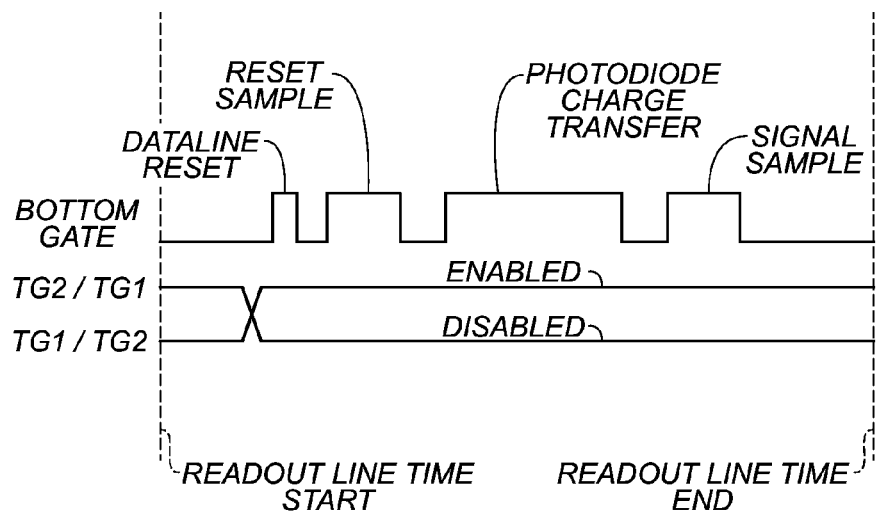

With respect to timing signals used to operate the control lines of the array structure of FIG. 7, one method is illustrated in FIG. 8A. The "ENABLE" and "DISABLE" states may be changed at the beginning of the line time or at the end of the line time. In FIG. 8A the charge injected from the top gate transitions will be cleared from the external readout electronics prior to reading a given pixel row in the array since a data line reset occurs prior to sampling (storing) the reset level of the pixel. As explained herein, two line times will be required for read out using the shared data line. The first line time is used to read out one of the mirrored pixels while the second line time may be used to read out the remaining pixel. A second timing scheme may be utilized as illustrated in FIG. 8B, the switch timing for "ENABLE" and "DISABLE" are complimentary and concurrent, so that charge cancellation on the data line will occur. In this example, no large change in charge will be seen by the external electronics.

Figure 8C:
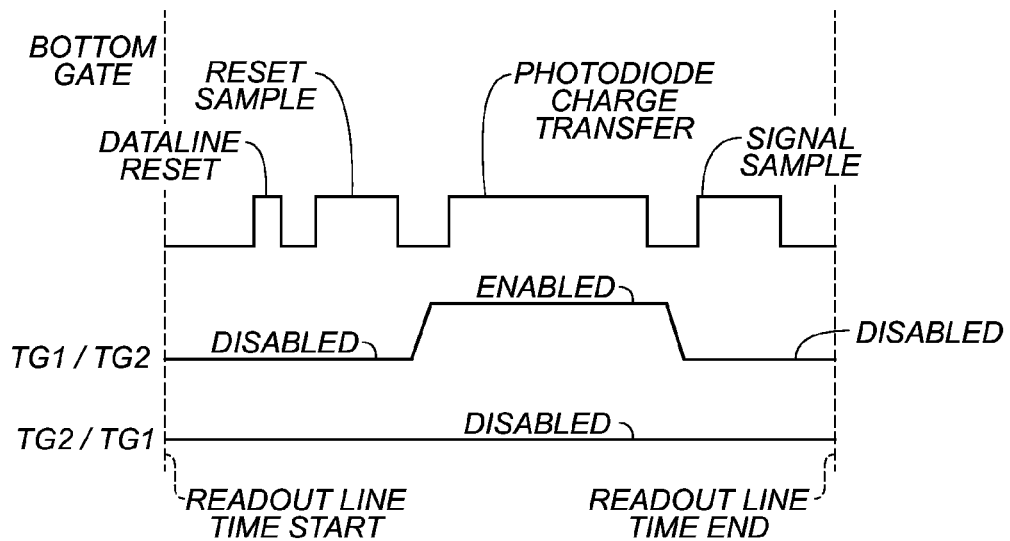
Figure 8D:
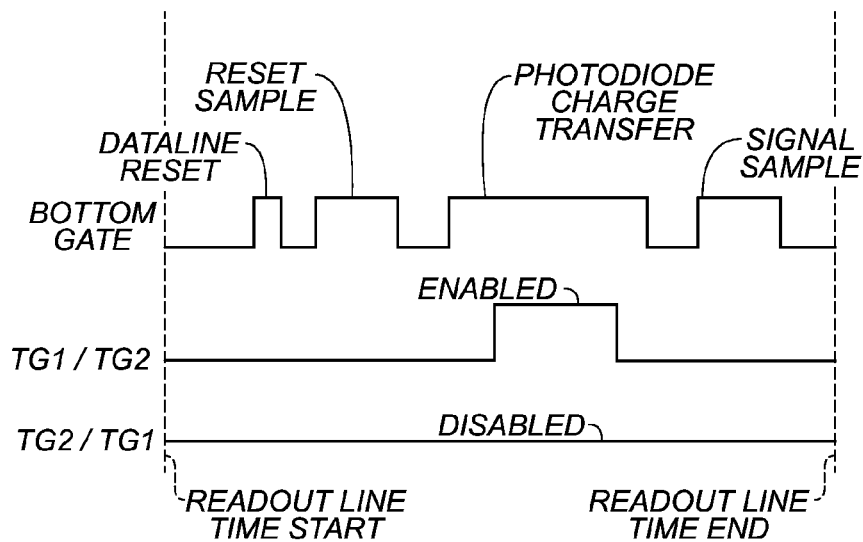

Other methods include alternating the "ENABLE" and "DISABLE" states just prior to or just after the photodiode (bottom gate) transfer signal, as illustrated in FIGS. 8C and 8D, respectively. In the top gate timing sequences of FIG. 8D, the charge transfer time is controlled by the top gate as it is enabled after the bottom gate is turned on and is disabled before the bottom gate turns off. In these examples, both the "ENABLE" and the "DISABLE" charge injections from the top gate transitions will be seen by the data line and the external readout electronics prior to sampling the final signal value. There should be a net charge injection cancelation of the top gate "ENABLE" and "DISABLE" transitions prior to sampling just as there is charge injection cancelation with the bottom gate "ON" and "OFF" transitions. The final net charge result that is sampled by the external readout electronics should only be the charge stored on the photodiode element.

In one embodiment, a high performance detector may also take advantage of this novel pixel architecture using horizontal charge sharing, or "binning". The arrangement of a 2×2 cell of horizontally shared pixels in a staggered row pair configuration is shown in FIG. 9A and a portion of a detector array utilizing the staggered row pair configuration is shown in FIG. 9B. This configuration is able to readout a physical pixel from every column in one readout line time. Although the arrangement of pixel readout will be in a staggered order, this array arrangement overcomes the disadvantage of requiring two line readouts for one physical row as described above with respect to the array of FIG. 7. This results in having the same readout frame rate as a non-multiplexed pixel architecture. This staggered configuration also allows for speed improvement compared to a non-multiplexed pixel architecture in a mode with 2× horizontal charge binning and 2×2 (4×) charge binning. In an example operation using the staggered row pair configuration, in one embodiment pixels labeled "1" may be read out individually by activating the corresponding bottom gate control line and one top gate control line, TG1, then, using the same procedure, the mirrored pixels labeled "2" may be read out individually in a next line time, using TG2, along the common data line as explained above in the example array operation of FIG. 7. The same sequence is then performed in a next row for pixels "3" and "4" individually, and so on, through the entire array. Note that four line times will read out the four rows of pixels in the staggered row pair configuration illustrated in FIG. 9B because the number of data lines is doubled as compared with the array of FIG. 7, i.e., the number of columns equals the number of data lines.

In one embodiment, a 2× horizontal binning may be performed for each row of the array of FIG. 9B whereby a corresponding bottom gate control line and top gate control lines, TG1 and TG2, are activated, as described herein, to readout simultaneously (in one line time) the charges stored in photodiodes of horizontally row-adjacent pixels labeled "1" and "2", along the data line common thereto, and, using a similar procedure in a subsequent line time, the charges stored in photodiodes of horizontally row-adjacent pixels labeled "3" and "4" may be simultaneously read out, and so on, through the entire array. Note that two line times for the 2× horizontal binning scheme will read out the four rows of pixels in the staggered row pair configuration illustrated in FIG. 9B.

In one embodiment, a 2×2 (4×) binning scheme may be implemented whereby corresponding bottom gate control lines for the four adjacent pixel rows illustrated in FIG. 9B are activated and top gate control lines, TG1 and TG2, are activated, as described herein, to readout simultaneously (in one line time) the charges stored in four photodiodes of vertically and horizontally adjacent pixels labeled "1", "2", "3", and "4" along the data line common thereto. Using a similar procedure for each subsequent group of four rows, the entire pixel array may be read out. Note that one line time for the 2×2 (4×) horizontal binning scheme will read out the entire four rows of pixels in the staggered row pair configuration illustrated in FIG. 9B.

Advantages of the apparatus and methods described herein include a novel horizontally adjacent in-pixel multiplexing apparatus having a common output data line by using a dual gate TFT structure that reduces a number of output data lines for lower cost solutions and adjacent horizontal charge binning by 2× with SNR benefit. The novel pixel array arrangement using the horizontally adjacent in-pixel multiplexing scheme in a 2×2 staggered row pair configuration results in no reduction of a full resolution frame-rate while still having a multiplexing pixel; an improvement in frame rate in a horizontal 2× charge binning compared to a standard approach readout scheme; and an improvement in frame rate in a 4× charge binning (2×2) modality compared to a standard approach readout scheme.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.), or an embodiment combining software and hardware aspects that may all generally be referred to herein as a "service," "circuit," "circuitry," "module," and/or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code and/or executable instructions embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer (device), partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified herein.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified herein.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A detector comprising:
   an array of pixels arranged in columns and rows, each of the pixels comprising a photosensor and a switch device, the switch devices each comprising a first terminal and a second terminal,
   wherein the switch device in each of a pair of adjacent pixels in a same row are both connected to a common data line via their first terminals and are both connected to a common bottom gate line via their second terminals, and wherein the common data line is adapted to read out image data from each of the pair of adjacent pixels in the same row.

2. The detector of claim 1, wherein the switch devices each comprise a TFT.

3. The detector of claim 1, wherein the switch devices each further comprise a third terminal, and wherein the switch device in each of the pair of adjacent pixels is each connected to one of a first top gate line and a second top gate line via the third terminal.

4. The detector of claim 3, wherein the switch devices in a common column of pixels are all connected to one of the first top gate line and the second top gate line.

5. The detector of claim 4, wherein the detector is configured to read out each pair of adjacent pixels in the array of pixels simultaneously in a first read out mode, and to read out each pixel in the array of pixels individually in a second read out mode.

6. The detector of claim 3, wherein the number of data lines in the array of pixels is half the number of columns of pixels in the array of pixels.

7. The detector of claim 6, wherein the number of first top gate lines in the array of pixels is half the number of columns of pixels in the array of pixels, the number of second top gate lines in the array of pixels is half the number of columns of pixels in the array of pixels, and wherein the number of bottom gate lines in the array of pixels is equal to the number of rows of pixels in the array of pixels.

8. The detector of claim 3, wherein the number of data lines, first top gate lines, and second top gate lines in the array of pixels is equal to the number of columns of pixels in the array of pixels, and wherein the data lines, the first top gate lines, and the second top gate lines are each connected to half the pixels in a corresponding column of pixels in the array of pixels.

9. The detector of claim 3, wherein the detector is configured to read out four adjacent pixels in the array of pixels simultaneously in a first read out mode, and to read out each pixel in the array of pixels individually in a second read out mode.

10. The detector of claim 3, wherein half the switch devices in each column of pixels in the array of pixels is connected to the common data line.

11. The detector of claim 10, wherein said half the switch devices in each column of pixels in the array of pixels is each connected to one of the first top gate line and the second top gate line.

12. A method of operating a detector comprising a two dimensional array of pixels, each of the pixels having a top gate, a photosensor, and a TFT switch connected between a data line and the photosensor, the method comprising:
   capturing a first radiographic image in the detector;
   activating the TFT switch and the top gate in each of two adjacent pixels in a same row; and
   simultaneously reading out the charge from each of the two adjacent pixels over only one data line, wherein the simultaneously read out charge from each of the two adjacent pixels comprises image information corresponding to the first radiographic image.

13. The method of claim 12, further comprising:
capturing a second radiographic image in the detector; and
reading out the charge individually from each of the pixels in the two dimensional array, wherein the individually read out charge from each of the pixels corresponds to the second radiographic image.

14. The method of claim 13, wherein the step of simultaneously reading out the charge from each of the two adjacent pixels comprises the step of activating a top gate line in each of the two adjacent pixels, and wherein the step of reading out the charge individually from each of the pixels comprises the steps of:
activating a first top gate line in a first one of the two adjacent pixels to read out the charge from the first one of the two adjacent pixels during a first line time; and
activating a second top gate line in a second one of the two adjacent pixels to read out the charge from the second one of the two adjacent pixels during a second line time.

15. A method of operating a detector comprising a two dimensional array of pixels, each of the pixels having a top gate, a photosensor, and a TFT switch connected between a data line and the photosensor, the method comprising:
capturing a first radiographic image in the detector;
activating the TFT switch and the top gate in each of two adjacent pixels in a first row and activating the TFT switch and the top gate in each of two adjacent pixels in a second row; and
simultaneously reading out the charge from the adjacent pixels in the first row and the second row over only one data line, wherein the simultaneously read out charge comprises image information corresponding to the first radiographic image.

16. The method of claim 15, further comprising:
capturing a second radiographic image in the detector; and
reading out the charge individually from each of the pixels in the two dimensional array, wherein the individually read out charge from each of the pixels corresponds to the second radiographic image.

17. The method of claim 16, wherein the step of reading out the charge individually from each of the pixels comprises the steps of:
activating a first top gate line in the first one of the two adjacent pixels in the first row to read out the charge therefrom during a first line time; and
activating a second top gate line in the second one of the two adjacent pixels in the first row to read out the charge therefrom during a second line time.

18. A detector comprising:
an array of pixels arranged in columns and rows, each pair of pixels in a common row of the array comprising a first pixel and a second pixel, the first pixel of each pair of pixels comprising:
a first photosensor; and
a first switch device including a first gate terminal connected to a bottom gate line common to all the pixels in the common row, and a first data terminal connected to a data line for reading out image data from the first pixel;
the second pixel of each pair of pixels comprising:
a second photosensor; and
a second switch device including a second gate terminal connected to the bottom gate line common to all the pixels in the common row, and a second data terminal connected to the data line for reading out image data from the second pixel,
wherein the first pixel of each pair of pixels further comprises a first additional gate terminal, and wherein the pixels in a first common column of the array are all connected to a first top gate line via the first additional gate terminals of the first switch devices in the first common column.

19. The detector of claim 18, wherein the second pixel of each pair of pixels further comprises a second additional gate terminal, wherein the pixels in a second common column of the array are all connected to a second top gate line via the second additional gate terminals of the second switch devices in the second common column.

* * * * *